United States Patent [19]
Brannon et al.

[11] Patent Number: 5,612,828
[45] Date of Patent: Mar. 18, 1997

[54] WRITE DRIVER WITH IMPROVEMENTS FOR RISETIME

[75] Inventors: Craig M. Brannon, Maplewood; Doug R. Peterson, Minnetonka; Pete J. Jung, Eagan, all of Minn.

[73] Assignee: VTC Inc., Bloomington, Minn.

[21] Appl. No.: 526,162

[22] Filed: Sep. 11, 1995

[51] Int. Cl.⁶ .................................. G11B 5/09; G11B 5/02
[52] U.S. Cl. ................................................ 360/46; 360/68
[58] Field of Search .............................. 360/46, 67, 68; 327/387

[56] References Cited

U.S. PATENT DOCUMENTS

| | | | |
|---|---|---|---|
| 4,523,238 | 6/1985 | Keel et al. | 360/46 |
| 4,816,934 | 3/1989 | Tsuyuguchi | 360/62 |
| 5,067,032 | 11/1991 | Ida | 360/46 |
| 5,132,852 | 7/1992 | Price, Jr. | 360/46 |
| 5,282,094 | 1/1994 | Ngo | 360/46 |
| 5,287,231 | 2/1994 | Shier et al. | 360/68 |
| 5,291,347 | 3/1994 | Ngo et al. | 360/68 |
| 5,296,975 | 3/1994 | Conteras et al. | 360/46 |

OTHER PUBLICATIONS

A. Pshaenich, *Electronic Design 4*, Feb. 15, 1977, pp. 86–91.
R. Grimmer, "Data Bus Driver", *IBM Technical Disclosure Bulletin*, vol. 20, No. 5, Oct. 1977.

*Primary Examiner*—W. C. Kim
*Assistant Examiner*—Regina Y. Neal
*Attorney, Agent, or Firm*—Kinney & Lange, P.A.

[57] ABSTRACT

The present invention discloses a write driver circuit for driving a magnetic head in an information storage system. The write driver circuit is connected to first and second voltage supply terminals and includes first and second data input terminals for receiving data input signals. The H-switch has a pair of pull-up transistors and a pair of pull-down transistors to switch current flow between a first direction and a second direction which is opposite to the first direction. A pair of anti-saturation circuits are connected to the H-switch to bias the pull-up transistors. The anti-saturation circuits contain a transistor having a collector, a base and an emitter and a pair of substantially similar diodes connected between the base and the collector of the transistor.

28 Claims, 3 Drawing Sheets

WRITE DRIVER WITH IMPROVEMENTS FOR RISETIME

BACKGROUND OF THE INVENTION

The present invention relates to a circuit which controls a magnetic head for storing information in a magnetic storage media. In particular, the present invention relates to a write driver circuit which has improved risetime thereby allowing information to be stored in the magnetic storage media at higher rates.

A magnetic storage system includes a magnetic head which stores ("writes") and retrieves ("reads") information from a recording surface of a magnetic media, such as a magnetic disc. The magnetic head includes an inductive coil which reads information from the storage medium by sensing changes in localized magnetic fields in domains in the medium in which information for a binary bit is stored and writes information by creating changes in the magnetizations at those domains to provide a representation for a binary bit in each. A preamplifier system is connected to the magnetic head coil at first and second head contacts. The preamplifier system includes read circuitry and write circuitry for controlling the read and write operations of the head, respectively.

The write circuitry includes a write current driver circuit which is connected across the head contacts. During write operations, the write driver circuit forces a relatively large write current through the inductive coil to create a magnetic field that magnetizes an adjacent domain on the recording surface in a selected direction. Bits of digital information are stored by providing magnetization in one of two opposite directions representing either a "1" or a "0" in the corresponding domain in the magnetic media, the magnetization direction selected by choosing one of two opposite directions for the current flow in the inductive coil.

A known write driver circuit includes an "H-switch" for controlling the direction of current flow through the inductive coil. The H-switch includes upper write switching (pull-up) transistors and lower write switching (pull-down) transistors. The pull-up transistors are connected between a first supply voltage and the head contacts. The pull-down transistors are connected between the head contacts and a second supply voltage through a write current generator, commonly referred to as a current sink. The write current sink includes a write current control transistor connected in series with a resistor.

FIG. 1 shows a circuit schematic diagram of a known implementation of an H-switch based write driver circuit as used in previous systems. An H-switch portion 100 is defined by transistors Q101, Q102, Q104, and Q105 along with resistor R103 and inductor L100. A current mirror is formed by transistors Q103, Q106, and Q107 along with resistors R101 and R102 and $I_{ref}$. Positive and negative voltage supply terminals ($V_{pos}$ and $V_{neg}$, respectively) are provided as are write data first (commonly called write data positive, hereinafter "WDP") 102 and write data second (commonly called write data negative, hereinafter "WDN") 104 signal input terminals. Transistors Q108, Q110, Q109 and Q111 along with diodes D101, D102, D103, D104, D105, D106, current sources I101, and I102, and resistors R104 and R105 form the biasing circuitry for the H-switch driver 100. I102 is a known current source and has a voltage drop across it of approximately one volt.

Write data is applied differentially at the write driver input terminals 102 and 104. There is a voltage differential between voltage signals applied to the WDP 102 and the WDN 104 terminals of approximately 0.5 volts, and the signals are centered approximately about 3.5 volts. When one of WDP 102 or WDN 104 is high, at approximately 3.75 volts, the other is low, at approximately 3.25 volts. If WDP 102 is high so that WDN 104 is low, current from source I102 flows through Q109 to bias the bases of Q104 and Q111 at about 1.4 volts switching them on while the bases of Q101 and Q110 will be near $V_{neg}$ potential switching them off. Q104, Q111, Q101 and Q110 are npn transistors with a Schottky diode connected between the bases and collectors to prevent hard saturation in the "on" condition, i.e. Schottky transistors.

Saturation occurs when both the emitter and collector junctions of a bipolar transistor are forward biased. Forward biasing a junction reduces the junction barrier which permits minority carrier injection, that is, it permits the holes from the p-type conductivity material side to be injected into the n-type conductivity material and electrons to flow in the opposite direction. When the transistor base-collector junction is forward biased, electrons are accelerated across the base-collector junction as well as the base-emitter junction leading to excess minority carrier storage in the base which must be removed before the transistor can be switched off. The Schottky diode limits the forward bias of the base-collector junction to reduce the storage of carriers in the base. The excess minority carrier storage can be modeled by nonlinear capacitance.

The base of Q105 will be driven to a low voltage by Q111 being switched on, therefore Q105 is switched off while current will be drawn from the emitter of Q102 through inductor L100 and resistor R103 by Q104 being switched on. The base potential of Q102 is held slightly below $V_{pos}$ due to the voltage drop across R104. Therefore, substantial current flows from the emitter of Q102 through L100 and R103 to the collector of Q104. The current flowing into the collector Q104 flows through the emitter of Q104 into the collector of current sink Q103 and on through the emitter of Q103 to the $V_{neg}$ terminal.

In the opposite situation with the WDN terminal 104 at the higher input signal voltage and the WDP terminal 102 at the lower, Q108 is switched on and is drawing current from source I102 which switches on Q101 and Q110. Transistor Q109 is switched off and, as a result, so are transistors Q104 and Q111. The inductive load L100 prevents an instantaneous change in current, and so will switch the direction of current through R103. The base of Q102 is driven to a low voltage and thus is switched off while current will be drawn from the emitter of Q105 through inductor L100 and resistor R103 by Q101 being switched on. The base potential of Q105 is held slightly below $V_{pos}$ due to the voltage drop across R105. Therefore, substantial current flows from the emitter of Q105 through L100 and R103 to the collector of Q101. The current flowing into the collector of Q101 flows out its emitter into the collector of current sink Q103 and out its emitter to the $V_{neg}$ terminal.

An important factor to consider in switching speed is how quickly the transistors in the H-switch can change states from off to on and vice-versa. In a common H-switch device, a current reversal through the head coil inductor depends in part on a RC time delay, for example, in FIG. 1, Q102 base capacitance with resistor R104. Additionally, the speed of the H-switch transition is directly proportional to the available voltage supply thereto. The rate at which information can be stored on a recording medium is directly proportional to the rate at which the direction of current flow can be reversed in the head inductive coil to thereby cause a change in the magnetic field. Also, switching on and off times of the transistors in the circuit directly effect the transition speed. A transistor that is not hard into saturation has a much quicker on to off switching time than a transistor that is so saturated because dissipating excess minority carrier charges stored in the transistor base is eliminated. There is a continuing need to improve write driver circuits to improve the speed of current transition therein.

SUMMARY OF THE INVENTION

The present invention is a write driver circuit for driving a magnetic head in an information storage system. The write driver circuit of the present invention is connected to first and second voltage supply terminals and includes first and second data input terminals for receiving data input signals. A magnetic head is connected between a plurality of transistors to form an H-switch. The H-switch has a pair of pull-up transistors and a pair of pull-down transistors to switch current flow between a first direction and a second direction which is opposite to the first direction. A pair of anti-saturation circuits are connected to the H-switch to bias the pull-up transistors and to prevent the pull-up transistors from saturating. The anti-saturation circuits contain a transistor having a collector, a base and an emitter and a pair of substantially similar diodes connected between the base and the collector of the transistor.

DETAILED DESCRIPTION OF THE PREFERRED EMBODIMENTS

Figure 1:
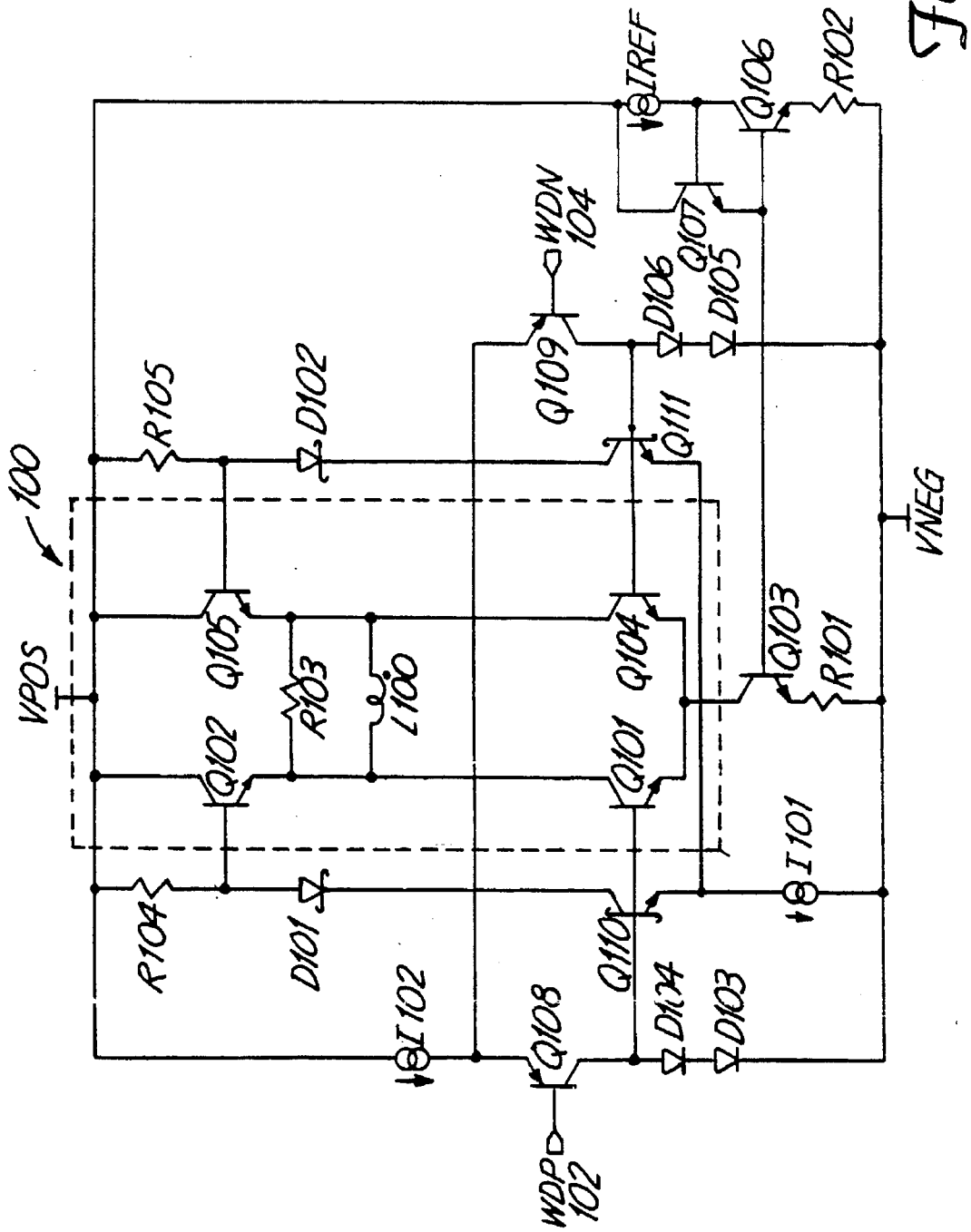
FIG. 1 is a circuit schematic diagram illustrating a prior art implemtation of an H-switch write driver circuit.
Figure 2:
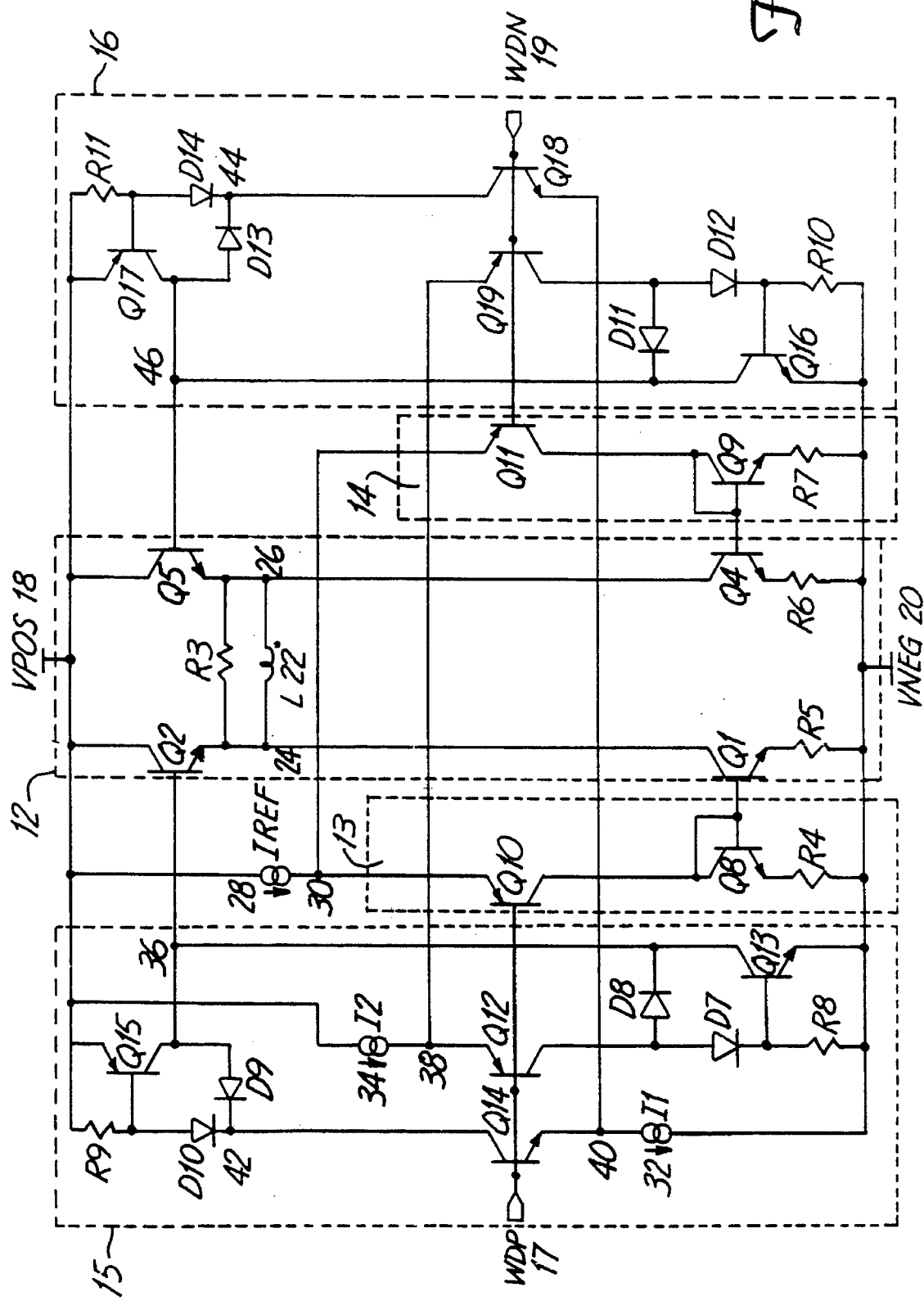
FIG. 2 is a circuit schematic diagram illustrating a write driver circuit in accordance with the present invention.

FIG. 2 is a circuit schematic diagram illustrating a write driver circuit 10 incorporating an H-switch configuration according to the present invention. The write driver 10 includes an H-switch device driver circuit 12, first and second biasing circuits 13 and 14, respectively, and first and second anti-saturation circuits 15 and 16, respectively. Write data first (commonly called write data positive, hereinafter "WDP") 17 and write data second (commonly called write data negative, hereinafter "WDN") 19 terminals are provided as data input terminals. Write data is applied differentially at the write driver input terminals 17 and 19. There is a voltage differential between the WDP 17 and the WDN 19 terminals of approximately 0.5 volts, and the signal swings are centered approximately about 3.5 volts. When one of WDP or WDN is high, the voltage value therein is approximately 3.75 volts, while the other is low with approximately 3.25 volts thereon. Positive and negative voltage supply terminals 18 and 20, ($V_{pos}$ and $V_{neg}$), respectively, are provided for the supply of voltage to the head to be connected thereto and these terminals are also connected to each of the H-switch device circuit portions set out above, driver circuit 12, the biasing circuits 13 and 14 and the anti-saturation circuits 15 and 16.

The H-switch device driver circuit 12 includes a pair of npn pull-up transistors Q2 and Q5, a pair of npn pull-down transistors Q1 and Q4, resistors R3, R5 and R6, and a magnetic head inductor coil 22. The H-switch device driver circuit 12 has first and second write current paths. The first write current path is defined by pull-up transistor Q2, the parallel combination of R3 and magnetic head inductor coil 22, pull-down transistor Q4 and resistor R6. The second write current path is defined by pull-up transistor Q5, the parallel combination of resistor R3 and magnetic head inductor coil 22, pull-down transistor Q1 and resistor R5. The H-switching device write driver circuit 12 applies a write current through the magnetic head inductive coil 22 by selectively applying write currents through the first and second write current paths.

In the first write current path, the collector of pull-up transistor Q2 is connected to $V_{pos}$. In a preferred embodiment, $V_{pos}$ is approximately 5 volts. The base of transistor Q2 is connected to the first anti-saturation circuit 15. Magnetic head inductive coil 22 has first and second head contact terminals 24 and 26, respectively. Resistor R3 is connected to both the first and second head contact terminals 24 and 26 and thus is parallel to magnetic head inductive coil 22. Resistor R3 is a damping resistor having a value in the range of 400–800 Ω, which limits ringing that results from resonance of inductive coil inductance with parasitic capacitance in the circuit 10 and shunts transient current resulting from forcing current reversals in the coil. In a steady state, virtually all of the current will flow through the head inductive coil 22 and not through resistor R3. The emitter of transistor Q2 is connected to the first head contact terminal 24. The collector of pull-down transistor Q4 is connected to the second head contact terminal 26. The base of transistor Q4 is connected to the second biasing circuit 14. Resistor R6 is connected between the emitter of transistor Q4 and $V_{neg}$. In the preferred embodiment, $V_{neg}$ is at ground potential. In the second write current path, the collector of transistor Q5 is connected to $V_{pos}$. The base of transistor Q5 is connected to the second anti-saturation circuit 16 while the emitter of transistor Q5 is connected to the second head contact terminal 26. The collector of pull-down transistor Q1 is connected to the first head contact terminal 24. The base of transistor Q1 is connected to the first biasing circuit 13. Resistor R5 is connected between the emitter of transistor Q1 and $V_{neg}$.

First and second biasing circuits 13 and 14 each comprise a reference current mirror used to bias the pull-down transistors in the lower half of the H-switch device driver circuit 12. The current mirrors use diode connected transistors for connection at the bases thereof to the corresponding driver pull-down transistor, and the emitter resistors set the ratio of the current mirrors at approximately twelve to one. The first biasing circuit 13 includes a reference current source $I_{ref}$ 28, between $V_{pos}$ and a terminal 30. A pnp transistor Q10 is provided with its emitter connected to terminal 30 and its base connected to the write drive terminal 17. A diode connected npn transistor Q8 is provided with its collector and its base connected to the collector of Q10. The base of transistor Q8 is also connected to the base of transistor Q1 in the H-switch device driver circuit 12. A resistor R4 is provided and is connected between the emitter of Q8 and $V_{neg}$.

The second biasing circuit 14 is substantially similar to the first biasing circuit and includes a pnp transistor Q11, a diode connected npn transistor Q9, and a resistor R7. The emitter of Q11 is connected to terminal 30, and the base of Q11 is connected to the WDN terminal 19 The collector and base of transistor Q9 are connected to the collector of Q11, and the base of Q9 is also connected to the base of transistor Q4 in the H-switch device driver circuit 12. Resistor R7 is connected between the emitter of transistor Q9 and $V_{neg}$. $I_{ref}$ flows either through transistor Q10 or transistor Q11 depending on the voltage states of the WDP 17 and the WDN 19 terminals, as will be described in great detail below.

The first and second anti-saturation circuits 15 and 16 respectively, are provided to bias the pull-up transistors Q2 and Q5 of the H-switch device driver circuit 12. They are also provided to increase switching speeds of the write driver circuit 10. In known prior art circuits, upper H-switch driver transition speeds depend on a RC time delay involving parasitic capacitance, among other things. The first and second anti-saturation circuits 15 and 16 reduce the RC time delay and also prevent saturation. As described in the background section above, preventing saturation of the transistors in the circuit is an important factor in increasing switching times, which in turn allows increased data rates.

The first anti-saturation circuit 15 includes pnp transistors Q12 and Q15, npn transistors Q13 and Q14, Schottky diodes D7, D8, D9, and D10, resistors R8 and R9, and current sink 32 for drawing current $I_1$ and current source 34 for providing current $I_2$, respectively. Current source 34 is a known current source and has a voltage drop across it of approximately one volt. Transistor Q13 has its collector connected to a terminal 36, and its emitter connected to $V_{neg}$. Resistor R8 is connected between the base of transistor Q13 and $V_{neg}$. Also connected to the base of transistor Q13 is the cathode of diode D7. The cathode of diode D8 is connected to terminal 36 which is also connected to the collector of transistor Q13 as stated above. The anodes of diodes D7 and D8 are both connected to the collector of transistor Q12. Transistor Q12 has its base connected to the WDP terminal 17 and its emitter connected to a terminal 38. Current source 34 for supplying current I2 is connected between terminal 38 and $V_{pos}$. Current sink 32 for drawing current I1 is connected between $V_{neg}$ and a terminal 40. The emitter of transistor Q14 is connected to terminal 40, its base is connected to the WDP terminal 17, and its collector is connected to the cathodes of both diodes D9 and D10 at a terminal 42. The anode of diode D9 is connected to the collector of transistor Q15 at terminal 36 while the anode of diode D10 is connected to the base of transistor Q15. Resistor R9 is connected between the base and the emitter of transistor Q15 and the emitter of transistor Q15 is also connected to $V_{pos}$.

The second anti-saturation circuit 16 is substantially similar to the first anti-saturation circuit 15. The second anti-saturation circuit includes pnp transistors Q17 and Q19, npn transistors Q16 and Q18, Schottky diodes D11, D12, D13, and D14, resistors R10 and R11, the current source 34, and the current sink 32. Transistor Q16 has its collector connected to terminal 46, and its emitter connected $V_{neg}$. Resistor R10 is connected between the base of transistor Q16 and $V_{neg}$. Also connected to the base of transistor Q16 is the cathode of diode D12. The cathode of diode D11 is connected to terminal 46 which is also connected to the collector of transistor Q16 as stated above. The anodes of diodes D11 and D12 are both connected to the collector of transistor Q19. Transistor Q19 has its base connected to the WDN terminal 19 and its emitter connected to terminal 38. The emitter of transistor Q18 is connected to terminal 40, its base is connected to the WDN terminal 19, and its collector is connected to the cathodes of both diodes D13 and D14 at a terminal 44. The anode of diode D13 is connected to the collector of transistor Q17 at a terminal 46 while the anode of diode D14 is connected to the base of transistor Q17. Resistor R11 is connected between the base and the emitter of transistor Q17 which is also connected to $V_{pos}$.

In steady state operation after an input voltage switching to having WDP terminal 17 relatively high and WDN terminal 19 relatively low, transistor Q14 is on and current $I_1$ flows through Q14 biasing diode D9, diode D10, transistor Q15 and resistor R9. The voltage across resistor R9 forward biases the emitter-base junction of transistor Q15, turning it on. Diodes D9 and D10 are both forward biased and both have current flowing through them. Diodes D9 and D10 are provided to prevent saturation of transistor Q15, thus, transistor Q15 is on and operating in its active region in being prevented from saturating. The combination of diodes D9 and D10 prevents saturation of transistor Q15 by maintaining the voltage potentials at the base and the collector of transistor Q15 substantially equal thus preventing the collector-base voltage from being greater than $V_{CBsat}$. This occurs because diodes D9 and D10 have similar characteristics.

The base of transistor Q2 is at the same potential as the collector of transistor Q15. The potential at the collector of transistor Q15 is determined by the following equation:

$$V_{collector} = V_{pos} - V_{BE} - V_{D10} + V_{D9}$$

Where:

$V_{Collector}$ is the voltage potential at the collector of transistor Q15;

$V_{pos}$ is the base to emitter voltage drop of transistor Q15 in the $V_{BE}$ is the positive voltage supply terminal 18; active region;

$V_{D10}$ is the voltage drop across diode D10;

$V_9$ is the voltage drop across diode D9.

Since diodes D9 and D10 are similar, they effectively cancel each other out, and what remains is $V_{collector} = V_{pos} - V_{BE}$ which is also the voltage on the base of transistor Q15. A typical value for $V_{BE}$ in the active region is 0.7 volts, thus the base of Q2 is at a potential of $V_{pos} - 0.7$ volts.

The combination of the currents flowing through diodes D9 and D10 at terminal 42 substantially equals I1. Because the WDP terminal 17 is high, transistor Q12 is off and, in turn, transistor Q13 is off. Therefore, no current is flowing through the collector of transistor Q13. Thus, the collector current from Q15 is supplied to the base of transistor Q2 so that this transistor is on.

Since, WDP terminal 17 is relatively high and WDN terminal 19 is low, transistor Q18 is off. Because there is no current flowing in the collector of transistor Q18, diodes D14 and D13 are off. With no current flowing through diodes D13 and D14, there is no current through resistor R11 and therefore there is no voltage across resistor R11. Accordingly, the voltage at the base of transistor Q17 is effectively $V_{pos}$. Because the voltages at the emitter and the base of transistor Q17 are virtually the same, transistor Q17 is off and there is no current flowing through the collector of transistor Q17.

Because WDP terminal 17 is high and WDN terminal 19 is low, transistors Q19 and Q11 are switched on and $I_2$ flows through transistor Q19 into the base of transistor Q16. Since, as was stated above, transistor Q17 is off, diode D11 provides the current conducting load at the collector of transistor Q16. The D11, D12 diode pair prevents saturation of transistor Q16 by holding the collector of transistor Q16 at the same potential as the base of transistor Q16 thus preventing the collector-base voltage from being greater than $V_{CBsat}$. As with diodes D9 and D10, diodes D11 and D12 have similar characteristics. The base of transistor Q5 is held by Q16 at a base-emitter junction voltage drop above $V_{neg}$ because of diodes D11 and D12, or approximately 0.7 volts.

With WDP terminal 17 being relatively high with respect to WDN terminal 19, transistor Q10 is off and, in turn, transistors Q1 and Q8 are off. Thus, no collector current flows through Q1. The current $I_{ref}$ is drawn through the emitter of switched on transistor Q11 and out of its collector to the bases of transistors Q4 and Q9, and to the collector of transistor Q9, connected as a diode, thus switching these transistors on. The resulting voltage drop from the base and collector of transistor Q9 over resistor R7 to $V_{neg}$ is forced to be matched by the voltage drop from the base of transistor Q4 over resistor R6 to $V_{neg}$. Choosing the value of resistor R6 to be $\frac{1}{12}$ that of resistor R7 requires 12 times as much current to flow into the collector of transistor Q4 as flows into the collector of transistor Q9 to maintain the voltage match at the bases of these two transistors. The ratio of R6 and R7 is not critical and any ratio may be chosen. In the preferred embodiment, a twelve to one ratio is chosen to save on power dissipation. With the twelve to one ratio, $I_{ref}$ need only be $\frac{1}{12}$ of the current flowing through the H-switch. With transistor Q2 switched on, current is drawn from the emitter of transistor Q2 to flow through magnetic head inductive coil 22 into the collector of switched on transistor Q4. The voltage the emitter of Q5 will be $V_{pos} - V_{BE15} - V_{BE2}$, or $V_{pos} - 1.4$ V, less the small voltage drop across coil 22 and resistor R3. Thus, transistor Q5 will be off since there is only 0.7 Volts on its base.

When the WDP terminal 17 subsequently is switched from relatively high to relatively low and reaches a steady state, and the WDN terminal 19 is correspondingly switched from relatively low to relatively high, the direction of current flow in the head inductive coil 22 will be reversed. The emitter-base junction of transistors Q12 and Q10 are then forward biased and transistors Q12 and Q10 turn on thereby supplying most of current I2 to the base of transistor Q13 turning it on and forward biasing diodes D7 and D8. With the WDP terminal 17 low, transistor Q14 is switched off and no current flows through the collector of transistor Q14. Therefore, no current flows through diodes D9 and D10. With no current flowing through diodes D9 and D10, there is no current through resistor R9 and therefore there is no voltage drop across R9. Accordingly, the voltage at the base of transistor Q15 is effectively $V_{pos}$. Because the voltages at the emitter and the base of transistor Q15 are virtually the same, transistor Q15 is off and there is no current flowing through the collector of transistor Q15. Since transistor Q15 is off and there is no current flowing through its collector, it stops supplying current to the base of transistor Q2. Any minority carriers stored in the base of transistor Q2 will be drawn through the collector of Q13 quickly switching transistor Q2 off by pulling the base of transistor Q2 to just 0.7 volts above $V_{neg}$. By keeping transistor Q15 out of saturation it can be switched off rapidly, and thus very little time is needed for transistor Q13 to switch transistor Q2 off. Diodes D8 and D7 keep transistor Q13 out of saturation allowing it to be subsequently switched off rapidly.

With WDN terminal 19 high, transistor Q18 is on and current I1 is drawn through transistor Q18, forward biasing D13 and D14 and drawing a current through resistor R11. The resulting voltage across resistor R11 forward biases the emitter-base junction of transistor Q17 to switch it on. The combination of diodes D13 and D14 prevents saturation of transistor Q17 by maintaining the voltage potentials at the base and the collector of transistor Q17 substantially equal, thus preventing the collector-base voltage from being greater than $V_{CBsat}$. This occurs because diodes D13 and D14 have similar characteristics. The collector of Q17 pulls up quickly because Q16, which will be switched off as will be described below, was not saturated allowing a quick switching off of that transistor. Therefore, the base of Q5 pulls tap quickly because there is no excess minority carrier charge in the base of Q16.

The base of transistor Q5 is at the same potential as the collector of transistor Q17. The potential at the collector of transistor Q17 is determined by the following equation:

$$V_{collector} = V_{pos} - V_{BE} - V_{D13} + V_{D14}$$

Where:

$V_{collector}$ is the voltage potential at the collector of transistor Q17;

$V_{pos}$ is the positive voltage supply terminal 18;

$V_{BE}$ is the base to emitter voltage drop of transistor Q17 in the active region;

$V_{D13}$ is the voltage drop across diode D13;

$V_{D14}$ is the voltage drop across diode D14. Since diodes D13 and D14 are similar, they effectively cancel each other out, and what remains is $V_{collector} = V_{pos} - V_{BE}$. A typical value for $V_{BE}$ in the active region is 0.7 volts, thus the base of Q5 is at a potential of $V_{pos} - 0.7$ volts.

Because the WDN terminal 19 is relatively high, transistor Q19 is off and, in turn, transistor Q16 is off. Therefore, no current is flowing through the collector of transistor Q16. Thus, the collector current of Q17 is supplied to the base of transistor Q5 so that this transistor is on.

With WDN terminal 19 being relatively high and WDP terminal 17 low, transistor Q11 is off and, in turn, transistors Q9 and Q4 are off. Thus, no collector current flows through Q4. The current $I_{ref}$ is drawn through the emitter of switched on transistor Q10 and out its collector to the bases of transistors Q1 and Q8, and to the collector of transistor Q8, connected as a diode, thus switching these transistors on. The resulting voltage drop from the base of transistor Q8 over resistor R4 to $V_{neg}$ is forced to be matched by the voltage drop from the base of transistor Q1 over resistor R5 to $V_{neg}$. Again choosing the value of resistor R5 to be $\frac{1}{12}$ that of resistor R4 requires 12 times as much current to flow into the collector of transistor Q1 as flows into the collector of transistor Q8 to maintain the voltage match at the bases of these two transistors.

With transistor Q5 switched on, current is drawn from the emitter of transistor Q5 to flow through the magnetic head inductive coil 22 into the collector of switched on transistor Q1. The voltage at the emitter of Q2 will be $V_{pos} - V_{BE17} - V_{BE5}$, –or $V_{pos} - 1.4$ V less the small voltage drop across coil 22 and resistor R23. Thus, Q2 will be off since there is only 0.7 V at its base.

Figure 3:
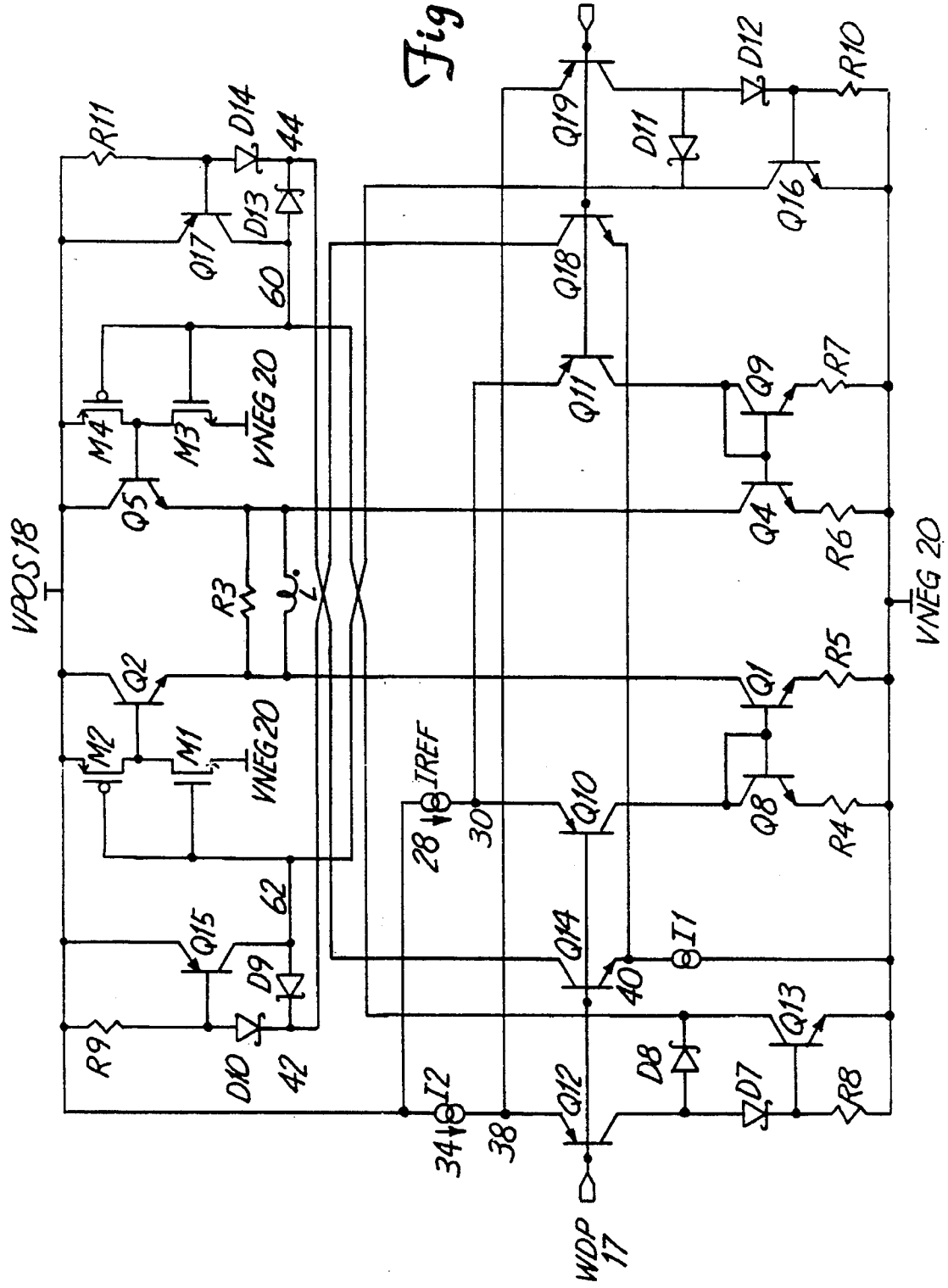
FIG. 3 is a circuit schematic diagram illustrating an alternative write driver circuit in accordance with the present invention.

FIG. 3 illustrates an alternative write driver circuit in accordance with the present invention. FIG. 3 adds CMOS inverters for driving the upper H-switch pull-up transistors in the write driver circuit. The very fast switching times and low output capacitance of CMOS invertors makes them a substantial improvement for the present invention. The circuit illustrated in FIG. 3 is substantially similar to the circuit of FIG. 2 and like elements have been correspondingly identified. By adding the CMOS invertors, the physical size of transistors Q15 and Q17 from FIG. 2 can be greatly reduced.

In FIG. 3, a first invertor formed by CMOS FETS M1 and M2 are connected as an inverting driver for transistor Q2 between transistors Q2 and Q15. A second invertor formed of CMOS FETs M3 and M4 are connected between transistors Q5 and Q17 as an inverting driver from transistor Q5. Due to the resulting signal polarity inversion, correct operation requires that the collector of transistor Q13 must now be connected to the collector of transistor Q17 and the input of the second invertor at a terminal 60. The collector of transistor Q16 is now connected to the collector of transistor Q15 and the input of the first invertor at a terminal 62. The collector of transistor Q14 now drives the base of transistor Q17, and the collector of transistor Q18 now drives the base of transistor Q15.

The source of FET M2 is connected to $V_{pos}$, and the source of FET M1 is connected to $V_{neg}$. The drains of both FET's M1 and M2 are connected to the base of transistor Q2 while the gates of both FET's M1 and M2 are connected to terminal 62 as its input. The source of FET M4 is connected to $V_{pos}$, and the source of FET M3 is connected to $V_{neg}$. The drains of both FET's M3 and M4 are connected to the base of transistor Q5 while the gates of both FET's M3 and M4 are connected to terminal 60 as its input. The operation of the circuit is substantially the same as described with respect to FIG. 2 taking into account the signal inversions.

Although the present invention has been described with reference to preferred embodiments, workers skilled in the art will recognize that changes may be made in form and detail without departing from the spirit and scope of the invention.

What is claimed is:

1. A write driver circuit for providing current through a transducer in an information storage system having first and second voltage supply terminals and first and second data input terminals, the write driver circuit comprising:

an H-switch connected to the first and second voltage supply terminals and to the first and second data input terminals, the H-switch having a pair of pull-up transistors and a pair of pull-down transistors;

a biasing circuit connected to each of the pull-down transistors to bias the pull-down transistors; and an anti-saturation circuit connected to each of the pull-up transistors to bias the pull-up transistors with the anti-saturation circuit containing at least one transistor having a collector, a base and an emitter and wherein a pair of diodes having an anode and a cathode are connected between the base and the collector of that transistor, wherein the cathodes of the diodes are connected together and wherein the diodes have substantially similar characteristics.

2. The circuit as in claim 1 wherein each of the pull-up and pull-down transistors has a control terminal for controlling current flow through the transistor.

3. The circuit as in claim 2 wherein the transducer is connected between the pull-up and the pull-down transistors.

4. The circuit as in claim 2 wherein the biasing circuit comprises a current mirror.

5. The circuit as in claim 4 wherein the current mirror has a reference current source, a first and second mirror transistor, and a resistor, each mirror transistor having a base, a collector and an emitter, wherein the reference current source is connected between the first voltage supply terminal and the first mirror transistor, the base of the first mirror transistor is connected to one of the data input terminals, the collector of the first mirror transistor is connected to the collector of the second mirror transistor, the collector of the second mirror transistor is also connected to the base of the second mirror transistor and to the control terminal of the pull-down transistor, and the resistor is connected between the emitter of the second mirror transistor and the second voltage supply terminal.

6. The circuit as in claim 2 wherein the anti-saturation circuit has first and second current supplies and first and second anti-saturation circuit portions.

7. The circuit as in claim 6 wherein the first anti-saturation circuit portion includes first and second anti-saturation transistors each having a collector, a base and an emitter, a resistor, and wherein the pair of diodes comprise a first and second diode, wherein the base of the first anti-saturation transistor is connected to one of the input terminals, the collector of the first anti-saturation transistor is connected to the anodes of the first and second diodes, the first current supply is connected between the emitter of the first anti-saturation transistor and the second voltage supply, the emitter of the second anti-saturation transistor is connected to the first supply terminal, the resistor is connected between the base and the emitter of the second anti-saturation transistor, the collector of the second anti-saturation transistor is connected to the control terminal of the pull-up transistor and the anode of the first diode, and the anode of the second diode is connected to the base of the second anti-saturation transistor.

8. The circuit as in claim 6 wherein the second anti-saturation circuit portion includes first and second anti-saturation transistors each having a collector, a base and an emitter, a resistor, and a first and second diode having an anode and a cathode, wherein the second current supply is connected between the first voltage supply terminal and the emitter of the first anti-saturation transistor, the base of the first anti-saturation transistor is connected to one of the in put terminals, the collector of the first anti-saturation transistor is connected to the cathodes of the first and second diodes, the emitter of the second anti-saturation transistor is connected to the second voltage supply terminal, the base of the second anti-saturation transistor is connected to the cathode of the first diode, the collector of the second anti-saturation transistor is connected to the control terminal of the pull-up transistor and the cathode of the second diode, the anodes of the first and second diodes are connected together, and the resistor is connected between the base of the second anti-saturation transistor and the second voltage supply terminal.

9. The circuit as in claim 8 wherein the first anti-saturation circuit portion further comprises first and second CMOS FETs connected between the collector of the second anti-saturation transistor and the control terminal of the pull-up transistors.

10. The circuit as in claim 9 wherein each of the CMOS FETs have a gate, a drain and a source, and wherein the gates of both the first and second CMOS FETs is connected to the collector of the second anti-saturation transistor, the source of the first CMOS FET is connected to the first voltage supply terminal, the source of the second CMOS FET is connected to the second voltage supply terminal., and the drains of the first and second CMOS FETs are connected to the control terminal of the pull-up transistors.

11. A write driver circuit for providing current through a transducer in an information storage system having first and second voltage supply terminals and first and second data input terminals, the write driver circuit comprising:

an H-switch connected to the first and second voltage supply terminals and to the first and second data input terminals, the H-switch having a pair of pull-up transistors and a pair of pull-down transistors, each pull-down transistor has a base, a collector and an emitter and wherein the collector of each pull-down transistor is connected to one of the pull-up transistors and the emitter of the pull-down transistor is connected to the second voltage supply terminal through only a load;

a biasing circuit connected to the base of each of the pull-down transistors to bias the pull-down transistors; and an anti-saturation circuit connected to each of the pull-up transistors to bias the pull-up transistors, wherein the anti-saturation circuit contains at least one transistor having a collector, a base and an emitter and wherein a pair of diodes having an anode and a cathode are connected between the base and the collector of the at least one transistor, wherein the cathodes of the diodes are connected together and wherein the diodes have substantially similar characteristics.

12. The circuit as in claim 11 wherein each of the pull-up and pull-down transistors has a control terminal for controlling current flow through the transistor.

13. The circuit as in claim 12 wherein the transducer is connected between the pull-up and the pull-down transistors.

14. The circuit as in claim 12 wherein the biasing circuit comprises a current mirror.

15. The circuit as in claim 14 wherein the current mirror has a reference current source, a first and second mirror transistor, and a resistor, each mirror transistor having a base, a collector and an emitter, wherein the reference current source is connected between the first voltage supply terminal and the first mirror transistor, the base of the first mirror transistor is connected to one of the data input terminals, the collector of the first mirror transistor is connected to the collector of the second mirror transistor, the collector of the second mirror transistor is also connected to the base of the second mirror transistor and to the control terminal of the pull-down transistor, and the resistor is connected between the emitter of the second mirror transistor and the second voltage supply terminal.

16. The circuit as in claim 12 wherein the anti-saturation circuit has first and second current supplies and first and second anti-saturation circuit portions.

17. The circuit as in claim 16 wherein the first anti-saturation circuit portion includes first and second anti-saturation transistors each having a collector, a base and an emitter, a resistor, and wherein the pair of diodes comprise a first and second diode, wherein the base of the first anti-saturation transistor is connected to one of the input terminals, the collector of the first anti-saturation transistor is connected to the cathodes of the first and second diodes, the first current supply is connected between the emitter of the first anti-saturation transistor and the second voltage supply, the emitter of the second anti-saturation transistor is connected to the first supply terminal, the resistor is connected between the base and the emitter of the second anti-saturation transistor, the collector of the second anti-saturation transistor is connected to the control terminal of the pull-up transistor and the anode of the first diode, and the anode of the second diode is connected to the base of the second anti-saturation transistor.

18. The circuit as in claim 16 wherein the second anti-saturation circuit portion includes first and second anti-saturation transistors each having a collector, a base and an emitter, a resistor, and a first and second diode having an anode and a cathode, wherein the second current supply is connected between the first voltage supply terminal and the emitter of the first anti-saturation transistor, the base of the first anti-saturation transistor is connected to one of the input terminals, the collector of the first anti-saturation transistor is connected to the anodes of the first and second diodes, the emitter of the second anti-saturation transistor is connected to the second voltage supply terminal, the base of the second anti-saturation transistor is connected to the cathode of the first diode, the collector of the second anti-saturation transistor is connected to the control terminal of the pull-up transistor and the cathode of the second diode, the anodes of the first and second diodes are connected together, and the resistor is connected between the base of the second anti-saturation transistor and the second voltage supply terminal.

19. The circuit as in claim 18 wherein the first anti-saturation circuit portion further comprises first and second CMOS FETs connected between the collector of the second anti-saturation transistor and the control terminal of the pull-up transistors.

20. The circuit as in claim 19 wherein each of the CMOS FETs have a gate, a drain and a source, and wherein the gates of both the first and second CMOS FETs is connected to the collector of the second anti-saturation transistor, the source of the first CMOS FET is connected to the first voltage supply terminal, the source of the second CMOS FET is connected to the second voltage supply terminal, and the drains of the first and second CMOS FETs are connected to the control terminal of the pull-up transistors.

21. A write driver circuit for providing current through a transducer in an information storage system having first and second voltage supply terminals and first and second data input terminals, the write driver circuit comprising:

an H-switch connected to the first and second voltage supply terminals and to the first and second data input terminals, the H-switch having a pair of pull-up transistors and a pair of pull-down transistors;

a first and second anti-saturation driver circuit connected to each of the pull-up transistors that operate in opposite directions to bias the pull-up transistors, wherein first and second current supplies are connected to the first and second anti-saturation driver circuits to provide current thereto, and wherein each of the first and second anti-saturation driver circuits contain first and second anti-saturation transistors having a collector, a base and an emitter, first and second diodes having an anode and a cathode, and a resistor, wherein the first and second diodes are connected between the base and the collector of the first anti-saturation transistor and wherein the cathodes of the first and second diodes are connected together and wherein the diodes have substantially similar characteristics; and a separate biasing circuit connected to each of the pull-down transistors to bias the pull-down transistors.

22. The circuit as in claim 21 wherein the transducer is connected between the pull-up and the pull-down transistors.

23. The circuit as in claim 21 wherein the biasing circuit comprises a current mirror.

24. The circuit as in claim 23 wherein the current mirror has a reference current source, a first and second mirror transistor, and a resistor, each mirror transistor having a base, a collector and an emitter, wherein the reference current source is connected between the first voltage supply terminal and the first mirror transistor, the base of the first mirror transistor is connected to one of the data input terminals, the collector of the first mirror transistor is connected to the collector of the second mirror transistor, the collector of the second mirror transistor is also connected to the base of the second mirror transistor and to the control terminal of the pull-down transistor, and the resistor is connected between the emitter of the second mirror transistor and the second voltage supply terminal.

25. The circuit as in claim 21 wherein in the first anti-saturation driver circuit, the base of the second anti-saturation transistor is connected to one of the input terminals, the collector of the second anti-saturation transistor is connected to the cathodes of the first and second diodes, the first current supply is connected between the emitter of the second anti-saturation transistor and the second voltage supply, the emitter of the first anti-saturation transistor is connected to the first supply terminal, the resistor is connected between the base and the emitter of the first anti-saturation transistor, the collector of the first anti-saturation transistor is connected to the pull-up transistor and the anode of the first diode, and the anode of the second diode is connected to the base of the second anti-saturation transistor.

26. The circuit as in claim 21 wherein in the second anti-saturation driver circuit, the second current supply is connected between the first voltage supply terminal and the emitter of the first anti-saturation transistor, the base of the first anti-saturation transistor is connected to one of the input terminals, the collector of the first anti-saturation transistor is connected to the anodes of the first and second diodes, the emitter of the second anti-saturation transistor is connected to the second voltage supply terminal, the base of the second anti-saturation transistor is connected to the cathode of the first diode, the collector of the second anti-saturation transistor is connected to the pull-up transistor and the cathode of the second diode, the anodes of the first and second diodes are connected together, and the resistor is connected between the base of the second anti-saturation transistor and the second voltage supply terminal.

27. The circuit as in claim 26 wherein the first anti-saturation circuit portion further comprises first and second CMOS FETs connected between the collector of the second anti-saturation transistor and the pull-up transistors.

28. The circuit as in claim 27 wherein each of the CMOS FETs have a gate, a drain and a source, and wherein the gates of both the first and second CMOS FETs is connected to the collector of the second anti-saturation transistor, the source of the first CMOS FET is connected to the first voltage supply terminal, the source of the second CMOS FET is connected to the second voltage supply terminal, and the drains of the first and second CMOS FETs are connected to the pull-up transistors.

* * * * *

UNITED STATES PATENT AND TRADEMARK OFFICE
CERTIFICATE OF CORRECTION

PATENT NO. : 5,612,828

DATED : MARCH 18, 1997

INVENTOR(S) : CRAIG M. BRANNON, DOUG R. PETERSON, PETE J. JUNG

It is certified that error appears in the above-indentified patent and that said Letters Patent is hereby corrected as shown below:

Col. 1, line 61, after first occurrence of "and", delete "1102", insert --I102--

Col. 2, line 43, after "source", delete "1102", insert --I102--

Col. 3, line 32, delete "implemtation", insert --implementation--

Col. 6, line 31, delete "$V_9$", insert --$V_{D9}$--

Col. 7, line 25, after "voltage", insert --at--

Col. 8, line 6, delete "tap", insert --up--

Signed and Sealed this

Fifteenth Day of July, 1997

*Attest:*

BRUCE LEHMAN

*Attesting Officer*     Commissioner of Patents and Trademarks